(12) United States Patent  
Chuang et al.

(10) Patent No.: US 7,652,511 B2  
(45) Date of Patent: Jan. 26, 2010

(54) SLEW-RATE CONTROL CIRCUITRY WITH OUTPUT BUFFER AND FEEDBACK

(75) Inventors: Che-Hao Chuang, Hsinchu (TW); Tang-Kuei Tseng, Hsinchu (TW); Ryan Hsin-Chin Jiang, Taipei (TW)

(73) Assignee: Amazing Microelectronic Corp., Taipei County (TW)

( * ) Notice: Subject to any disclaimer, the term of this patent is extended or adjusted under 35 U.S.C. 154(b) by 192 days.

(21) Appl. No.: 12/015,395

(22) Filed: Jan. 16, 2008

(65) Prior Publication Data

US 2009/0179679 A1  Jul. 16, 2009

(51) Int. Cl.  
*H03K 3/00* (2006.01)

(52) U.S. Cl. .................................... 327/112; 327/108

(58) Field of Classification Search .................. 327/170, 327/112, 108; 326/85, 87  
See application file for complete search history.

(56) References Cited

U.S. PATENT DOCUMENTS

| | | |
|---|---|---|
| 5,587,678 A | 12/1996 | Dijkmans |
| 5,736,888 A | 4/1998 | Sharpe-Geisler |
| 5,748,019 A | 5/1998 | Wong et al. |
| 5,949,259 A | 9/1999 | Garcia |
| 6,031,389 A | 2/2000 | Fotouhi et al. |
| 6,194,935 B1 | 2/2001 | Pioppo et al. |
| 7,012,451 B2 * | 3/2006 | Srikanth et al. ............. 327/108 |
| 7,164,298 B2 * | 1/2007 | Sung ........................... 327/112 |
| 7,295,047 B2 * | 11/2007 | Lee et al. ..................... 327/108 |

OTHER PUBLICATIONS

F. Garcia, P. Coll, D. Auvergne, "Design of a slew rate controlled output buffer", IEEE ASIC, 1998 p. 13-16.

* cited by examiner

*Primary Examiner*—Hai L Nguyen  
(74) *Attorney, Agent, or Firm*—Ming Chow; Sinorica, LLC

(57) ABSTRACT

The present invention proposed a slew-rate control circuitry without the use of external components such as amplifiers. Therefore slew-rate control circuitry of the present invention not only provides an IC with build-in slew-rate control, but also reduces number of transistors used externally which will increase gate-oxide reliability of the IC. The slew-rate control circuitry of the present invention is primarily comprised by an output buffer and feedback circuitry, the output buffer mainly consisted four transistors and depends on output of the IC, these four transistors will interact with each other to control the slew-rate of IC output. Additional feedback circuitry and gate-tracking circuitry are also disclosed to enhance the performance of the slew-rate control circuitry.

11 Claims, 6 Drawing Sheets

SLEW-RATE CONTROL CIRCUITRY WITH OUTPUT BUFFER AND FEEDBACK

BACKGROUND OF THE INVENTION

1. Field of the Invention

The present invention generally relates to an slew-rate control circuitry, and particularly to a slew-rate control circuitry consists of output buffer and feedback.

2. Description of the Related Art

For a good design of an integrate circuit (IC), output driver is one of the essential component which will determine IC's overall performance especially on the field of data and telecommunication system since they are often required to comply with specified interface. As an example, the output driver for RS232 serial interface standard must support the driving of a resistive load of about 3-7 k ohms with a voltage swing greater than ±5 volts and the driving of a capacitive load of about 2500 pF at a frequency of 250 Kbps since the load for RS232 is ohmic-capative type. Therefore it is very important to have precise control of the slew rate of the output driver so that the edge transitions of the output signal can be maintained within acceptable range and additionally ensure an accurate control of the output waveform as the load connected to the output driver varies which will often affect data transmission rate. For an ideal design of the RS232 output buffer, the slew rate must be kept under 30 volts/usec in order to minimize undesirable high frequency components of the output signal which may cause high electromagnetic interference (EMI) due to high output edge switching rates.

Since the output buffers for IC has so many constraints due to the above-mentioned requirements, traditional design of output buffers is being limited by DC operating characteristics which affect the sizing of output transistor. As a result, high current peaks will occur with the simultaneous switching of output buffers and the inductive power supply noise will create high voltage drop. FIG. 1 is a circuit for a traditional output buffer with slew-rate control, the pre-driver 2 is connected to a P-channel Metal Oxide Semiconductor (PMOS) 4 and a N-channel Metal Oxide Semiconductor (NMOS) 6. The pre-driver 2 further connected to a supply voltage VDD of 2.5 volts in one end and VSS of 0 volts at another end. The outcome of this circuit provides a switching voltage with push-pull configuration to the I/O pad 8. The output voltage from I/O pad 8 is then connected to a resistor 10 for ESD protection, a input inverter 14 and another NMOS 12 for CDM ESD protection before going to the internal circuit. The disadvantage with such design is that when the input signal has greater voltage than the VDD, leakage current is likely to occur at the output of PMOS 4 and parasitic drain-to-well junction diode section 16 due to the large biased voltage. In addition, there will also be gate-oxide reliability concern at the output of NMOS 6, gate-grounded NMOS 12 and input inverter 14 since they are exposed outside of the IC.

Based upon the foregoing, the aim of the present invention is to provide a slew-rate control circuit with better output buffer performance and gate-tracking ability without the requirement of using external component. The output buffer of the slew-rate control circuit not only provides an IC with build-in slew-rate control and better gate-oxide reliability, but also reduces the number of MOS used externally which decreases the cost of manufacturing.

BRIEF SUMMARY

Based upon the foregoing, the present invention is proposing a slew-rate control circuitry with output buffer and gate-tracking ability without the requirement of using external component such as amplifiers. Therefore the output buffer of the slew-rate control circuit not only provides an IC with build-in slew-rate control, but also reduces number of transistors used externally which will increase gate-oxide reliability of the IC.

The output buffer of slew-rate control circuitry of the present invention comprises a first P-channel MOS transistor switch having its source connected to a supply voltage and its gate receives an output signal from said input controlled logic unit and a second P-channel MOS transistor switch having its source connected to drain of said first PMOS switch, its gate connected to a ground and its drain connected to an output. A first N-channel MOS transistor switch having its drain connected to a reference voltage and its gate receives an output signal from said input controlled logic unit and a second N-channel MOS transistor switch having its drain connected to source of said first N-channel MOS transistor switch, its gate connected to a ground and its drain connected to said output. Therefore depends on output of the IC, the four transistors will interact with each other to control the slew-rate of the output buffer. Additional feedback circuitry and gate-tracking circuitry are also disclosed in accordance with the present invention to enhance the performance of the output buffer and slew-rate control.

Other objects, advantages and novel features of the invention will become more apparent from the following detailed description when taken in conjunction with the accompanying drawings, in which:

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
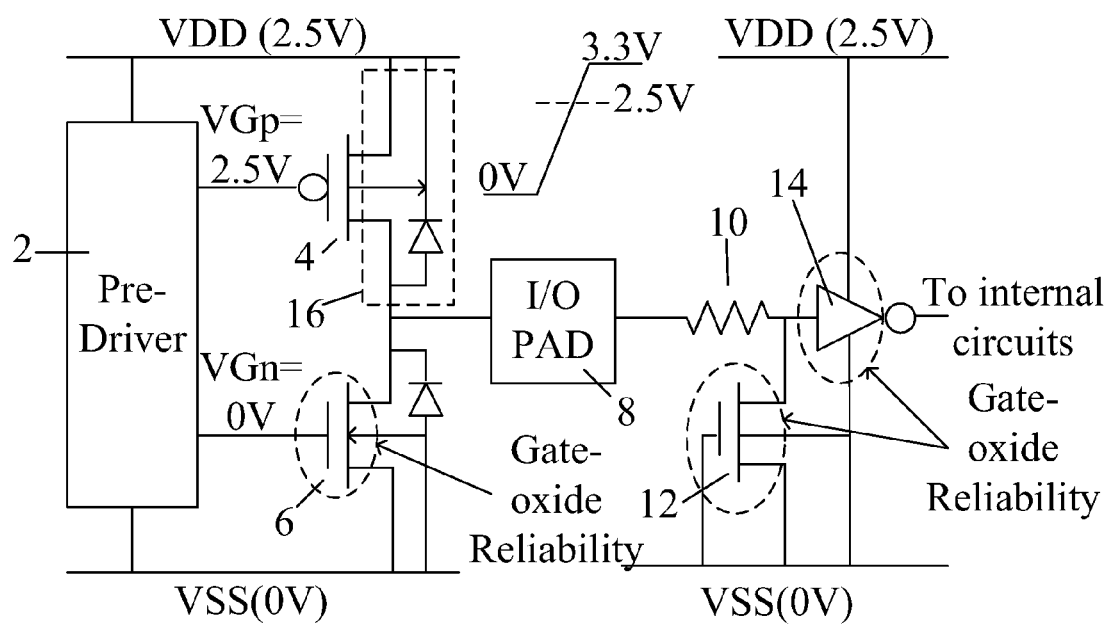
FIG. 1 is a schematic diagram of a conventional output buffer with slew-rate control.
Figure 2:
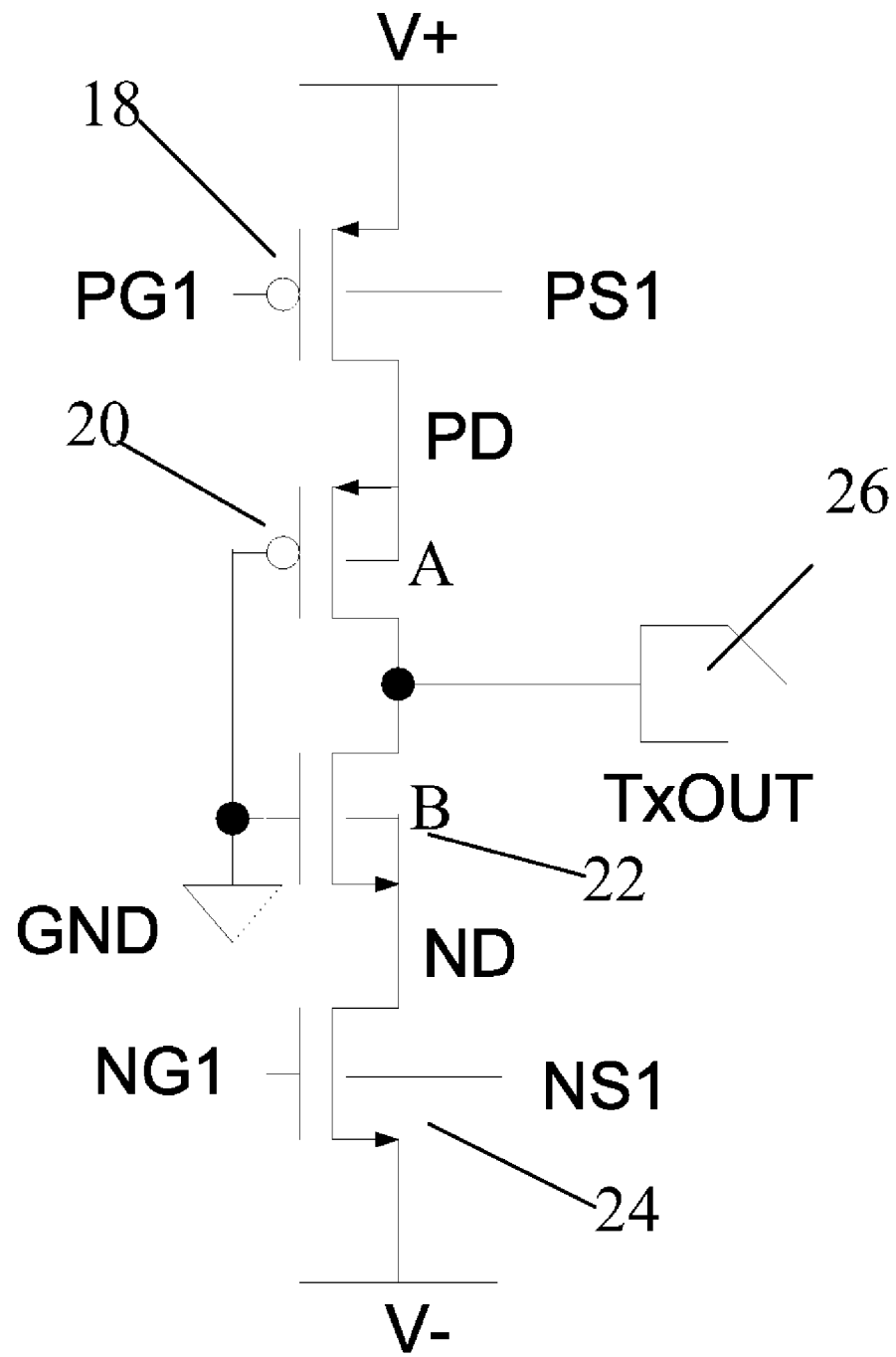
FIG. 2 is a schematic diagram of output buffer circuit of the present invention.

The slew-rate control circuitry of the present invention primarily comprises an output buffer which receives signal from at least one input and provides at least one output, and at least one feed back circuitry. Referring to FIG. 2 for the output buffer in accordance with the present invention which comprises two P-channel MOS transistors (PMOS 18 and 20) and two N-channel MOS transistors (NMOS 22 and 24). PMOS 18 has its source connected to a supply voltage V+ and its drain connected to the source of PMOS 20, the gate of PMOS 18 in addition receives an input signal from an input controlled logic. The source of NMOS 24 is connected to a reference voltage V− and the drain of NMOS 24 is connected to the source of NMOS 22, the gate of NMOS 24 also receives an input signal from the input controlled logic like PMOS 18. Both gates for PMOS 20 and NMOS 22 are connected to a ground and the source of PMOS 20 is connected to the drain of NMOS 22 to provide a transmission output TxOUT 26.

Figure 3:
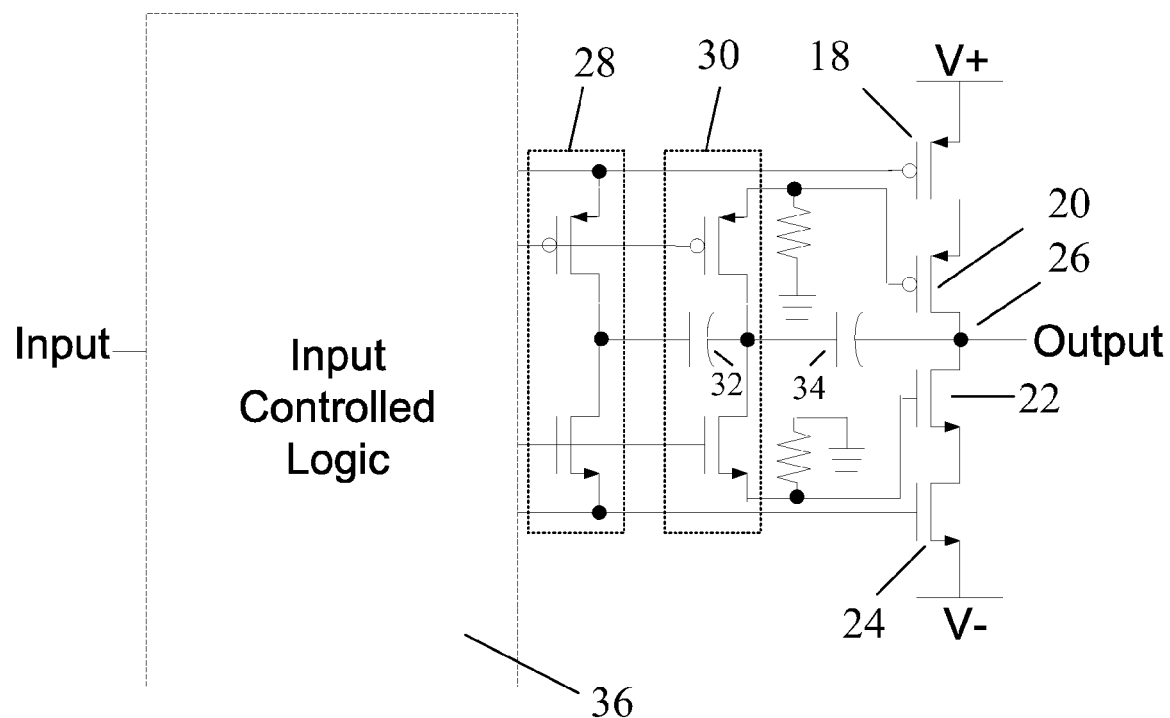
FIG. 3 is a schematic diagram to a preferred embodiment of the present invention.

In order to provide more stable slew rate control, the circuitry for the present invention requires at least one feedback circuitry. As shown in FIG. 3, at least one feedback capacitor can be added between the output 26 and the input controlled logic 36. In this embodiment of the present invention, a feedback capacitor 34 is added to output 26 in one end, the other end of feedback capacitor 34 is connected to feedback MOS device 30. Feedback MOS device 30 is simply comprised by a PMOS and a NMOS. The drain of PMOS is connected to the source of NMOS to provide an output to the feedback capacitor 34. The source of PMOS of Feedback MOS device 30 and the drain of NMOS of feedback MOS device 30 is connected the ground. With the configuration mentioned above, the charging and discharging for feedback capacitor 34 can be well controlled by the feedback MOS device 30. To provide better efficiency for the feedback, a designer can add more set of feedback MOS device to the IC. For example, another feedback capacitor 32 can be added between feedback capacitor 34 and the input controlled logic 36. Same as the circuitry mentioned above, another feedback MOS device 28 is required to control the current stored in feedback capacitor 32.

Figure 4:
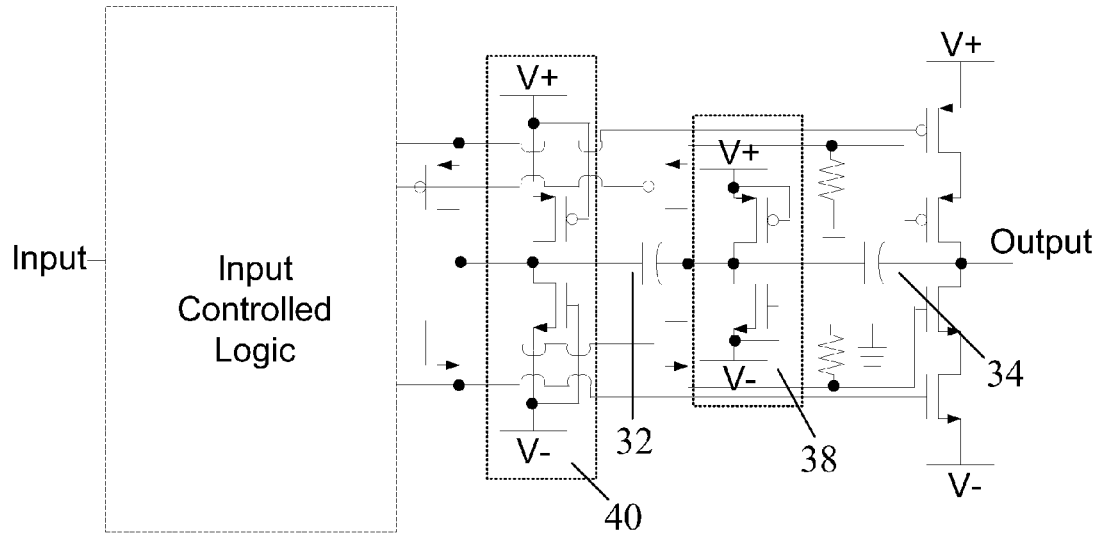
FIG. 4 is a schematic diagram to a preferred embodiment of the present invention.

In order to avoid the feedback MOS device mentioned above from gate-oxide overstress which typically occurs during shutdown mode, the feedback circuitry can further be modified into a gate-tracking circuitry by placing few MOS between the feedback capacitor and the input controlled logic as shown in FIG. 4 to increase the gate-oxide reliability. In FIG. 4, gate-tracking circuitry 38 which comprises a PMOS and a NMOS is placed between the feedback capacitor 34 and the feedback capacitor 32. The source of PMOS of gate-tracking circuitry 38 is connected to a supply voltage V+ and its gate. The drain of NMOS of gate-tracking circuitry 38 is connected to its gate and a reference voltage V−. The drain of PMOS and the source of NMOS for the gate-tracking circuitry 38 are then connected to the capacitor 34 to bias the feedback point of capacitor 34 to V+/V−. Structure of gate-tracking circuitry 40 for capacitor 32 is the same as the gate-tracking circuitry 38 for capacitor 34, the source of PMOS of gate-tracking circuitry 40 is connected to a supply voltage V+ and its gate. The drain of NMOS of gate-tracking circuitry 40 is connected to its gate and a reference voltage V−. The drain of PMOS and the source of NMOS for the gate-tracking circuitry 40 are then connected to the capacitor 32 to bias the feedback point of capacitor 32 to V+/V−. As a result, the possibility of having gate-oxide overstress can be eliminated.

Figure 5:
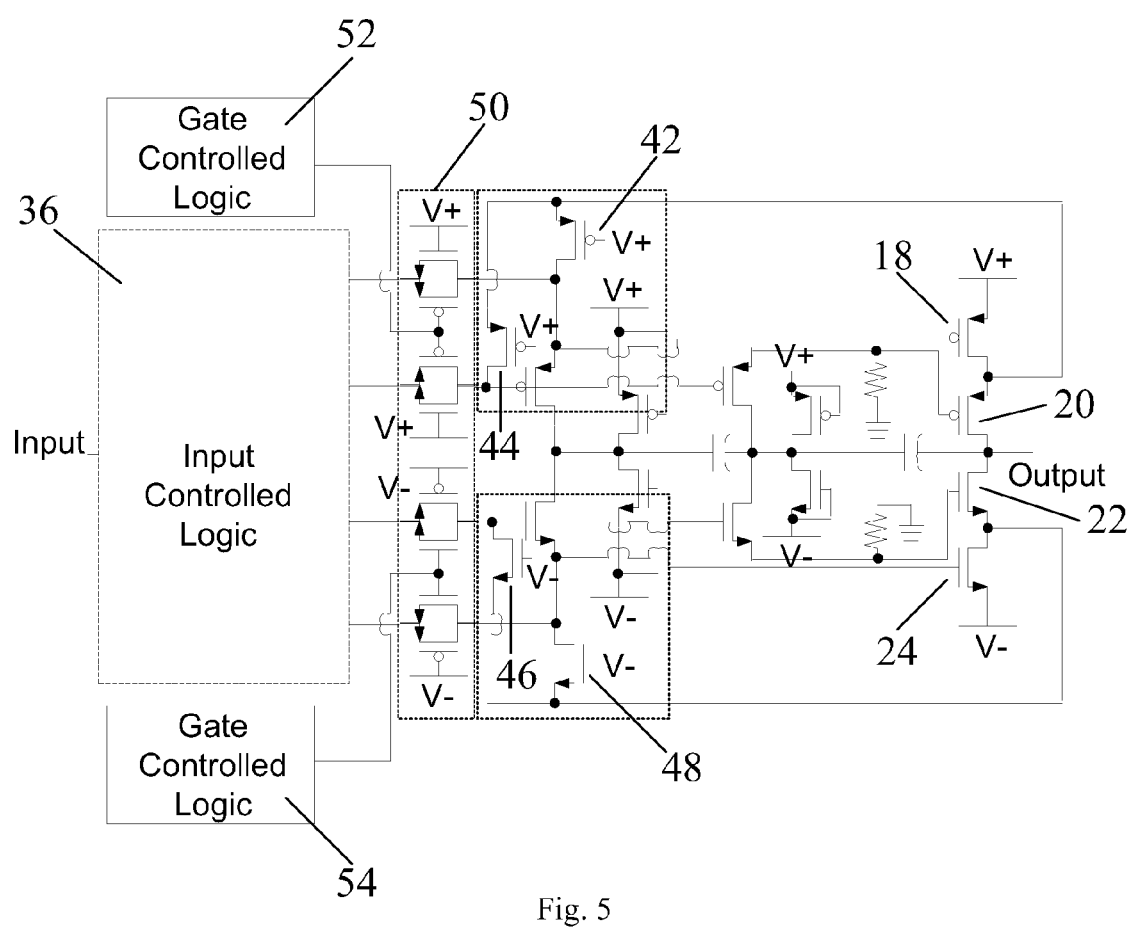
FIG. 5 is a schematic diagram to a preferred embodiment of the present invention.

Most IC requires at least two power sources such as supply voltage and reference voltage. However, in order for an IC to effectively shut off the power supply during shutdown (tri-state) mode, it is a benefit to have third power supply and extra switches to halt the power supply during the shutdown mode as shown in FIG. 5. In FIG. 5, four more switches are being added into the gate-tracking circuitry, two PMOS 42 and 44 are connected in parallel, both have their source connected to the drain of PMOS 18 (source of PMOS 20) of the output buffer. The gate for both PMOS 42 and 44 is connected to a supply voltage V+ and the drain of PMOS 42 is connected to the gate of PMOS 18 where the drain of PMOS 44 is connected to gate of feedback PMOS. Two NMOS 46 and 48 are connected in parallels, both have their drain connected to the drain of NMOS 22 (source of NMOS 24) of the output buffer. The gate for both NMOS 46 and 48 is connected to a reference voltage V− and the source of NMOS 48 is connected to the gate of NMOS 24 where the source of NMOS 46 is connected to gate of feedback NMOS. With these MOS switches (42, 44, 46, 48), they can effectively turn-off the feedback MOS device during the shutdown mode.

Figure 6:
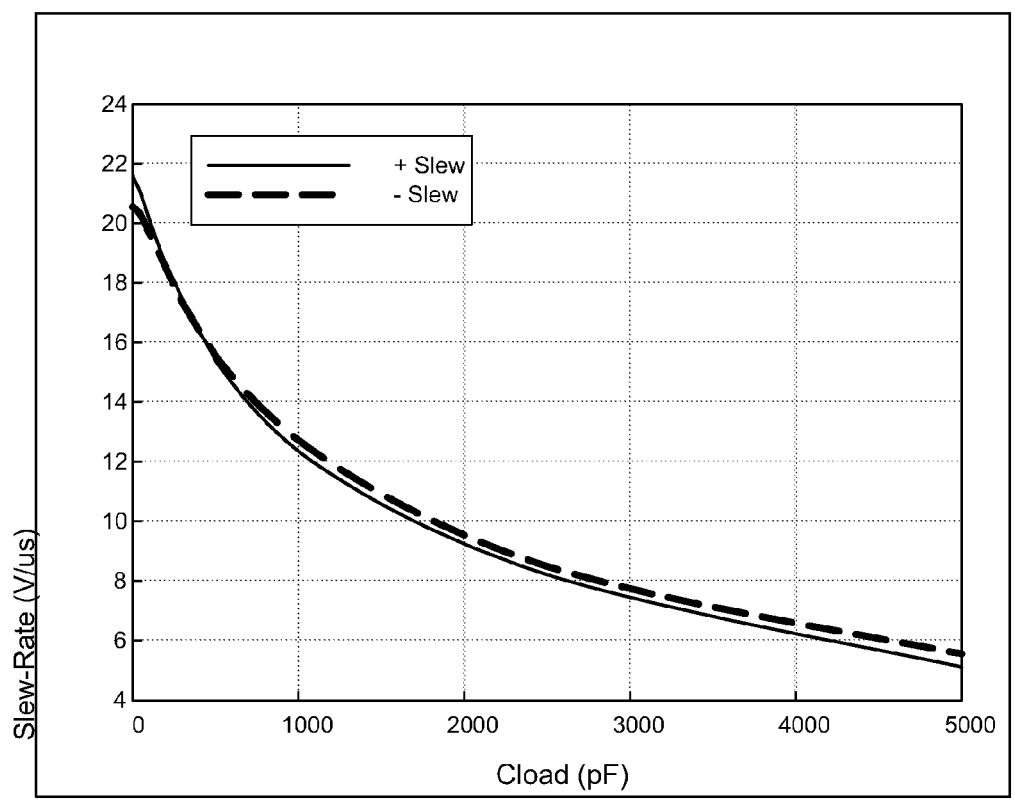
FIG. 6 is a chart representing the relationship between slew-rate and load for the present invention.

The gate-tracking circuitry further includes two gate controlled logic and a MOS shutdown (tri-state) circuitry 50 is being implemented which consists series connection of PMOS and NMOS transistors. In shutdown circuitry 50 of the present invention, by looking down from top to bottom, a first NMOS has its gate connected to the supply voltage V+ and its source connected to the drain of a first PMOS and the drain of PMOS 42. The drain of the first NMOS is connected to the source of the first PMOS and the point of their connection also received an input signal from the input controlled logic 36. The gate of the first PMOS is connected to a gate controlled logic 52. A second NMOS has its gate connected to the supply voltage V+ and its source connected to the drain of a second PMOS and the drain of PMOS 44. The drain of the second NMOS is connected to the source of the second PMOS and the point of their connection also received an input signal from the input controlled logic 36. The gate of the second PMOS is also connected to the gate controlled logic 52. A third PMOS has its gate connected to the reference voltage V− and its drain connected to the source of a third PMOS and the source of NMOS 46. The source of the third PMOS is connected to the drain of the third NMOS and the point of their connection also received an input signal from the input controlled logic 36. The gate of the third PMOS is connected to a gate controlled logic 54. A fourth PMOS has its gate connected to the reference voltage V− and its drain connected to the source of a fourth PMOS and the source of NMOS 48. The source of the fourth PMOS is connected to the drain of the fourth NMOS and the point of their connection also received an input signal from the input controlled logic 36. The gate of the third PMOS is connected to the gate controlled logic 54. With such circuit configuration, the shutdown circuitry can block the ± voltage into the input controlled logic 36 during shutdown mode for the output buffer. FIG. 6 is a chart representing the relationship between slew-rate and capacitive load for the present invention where the solid line represents positive slew-rate and the broken line represents negative slew-rate. It can be easily observed from the chart, the slew-rate can be controlled to lower than 30V/us with loading capacitance from 0 pF to 5000 pF.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:
1. A slew-rate control circuitry, comprising:
   an input controlled logic unit, receives signal from at least one input and provides at least one output; and
   an output buffer circuitry, receives signal from at least one input and provides at least one output, including:
      a first P-channel MOS transistor switch having a source connected to a supply voltage and its gate receives an output signal from said input controlled logic unit;
      a second P-channel MOS transistor switch having a source connected to drain of said first PMOS switch, a gate connected to a circuit and a drain connected to an output;

a first N-channel MOS transistor switch having a drain connected to a reference voltage and a gate receives another output signal from said input controlled logic unit; and a second N-channel MOS transistor switch having a drain connected to source of said first N-channel MOS transistor switch, a gate connected to the circuit and a source connected to the output; and at least one feedback MOS circuitry, provides control over feedback for said slew-rate control circuitry, including;

a capacitive element connected to output in one end;

a third P-channel MOS transistor switch having a source connected to gate of said first P-channel MOS transistor, a gate connected to said input controlled logic unit and a drain connected to other end of said capacitive element; and a third N-channel MOS transistor switch having a drain connected to gate of said first N-channel MOS transistor, a gate connected to said input controlled logic unit and a source connected to said capacitive element.

2. The slew-rate control circuitry as claimed in claim 1, wherein feedback MOS circuitries provide control of charging and discharging for said capacitive element.

3. The slew-rate control circuitry as claimed in claim 1, wherein said second P-channel MOS transistor bypasses supply voltage to output.

4. The slew-rate control circuitry as claimed in claim 1, wherein said second N-channel MOS transistor bypasses reference voltage to output.

5. The slew-rate control circuitry as claimed in claim 1, wherein at least one gate-tracking circuitry is placed between feedback capacitor and said input controlled logic to prevent feedback MOS circuitry having gate-oxide overstress during shutdown mode.

6. The slew-rate control circuitry as claimed in claim 5, wherein gate-tracking circuitry comprises:

a P-channel MOS transistor having a source connected to the supply voltage and a gate; and a N-channel MOS transistor having a drain connected to the reference voltage and a gate, drain of P-channel MOS transistor is connected to source of N-channel MOS transistor and then connected to said capacitive element.

7. The slew-rate control circuitry as claimed in claim 5, wherein gate-tracking circuitry biases feedback point of said capacitive element to either supply voltage or reference voltage.

8. The slew-rate control circuitry as claimed in claim 5, wherein gate-tracking circuitry is further modified into a shutdown circuitry to halt power supply during the shutdown mode.

9. The slew-rate control circuitry as claimed in claim 8, wherein said shutdown circuitry blocks the supply voltage and reference voltage during shutdown mode for the output buffer.

10. The slew-rate control circuitry as claimed in claim 8, wherein said shutdown circuitry which performs turning-off feedback MOS devices during shutdown mode comprises:

Two P-channel MOS transistors connected in parallel with their source connected to the drain of said first P-channel MOS transistor, their gate is connected to the supply voltage and, drain of one of the P-channel MOS transistors is connected to the gate of output buffer PMOS and the drain of another P-channel MOS is connected to gate of feedback PMOS; and Two N-channel MOS transistors connected in parallel with their drain connected to the source of said first N-channel MOS transistor, their gate is connected to the reference voltage and, source of one of the N-channel MOS transistors is connected to the gate of output buffer NMOS and the drain of another N-channel MOS is connected to gate of feedback NMOS.

11. The slew-rate control circuitry as claimed in claim 8, wherein said shutdown circuitry which blocks supply and reference voltage during shutdown mode is comprised by gate controlled logic and series connection of P-channel MOS transistor and N-channel MOS transistors.

* * * * *